United States Patent
Yang

(10) Patent No.: US 7,405,939 B2
(45) Date of Patent: Jul. 29, 2008

(54) FASTENING DEVICE AND HEAT SINK ASSEMBLY USING THE SAME

(75) Inventor: Chih-Hao Yang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 32 days.

(21) Appl. No.: 11/615,908

(22) Filed: Dec. 22, 2006

(65) Prior Publication Data

US 2008/0037225 A1    Feb. 14, 2008

(30) Foreign Application Priority Data

Aug. 11, 2006    (CN) .................... 2006 1 0062082

(51) Int. Cl.
*H05K 7/20* (2006.01)
*H01L 23/34* (2006.01)
*F16B 19/00* (2006.01)

(52) U.S. Cl. .................... 361/719; 257/719; 361/704; 411/508

(58) Field of Classification Search ......... 257/718–719; 361/719
See application file for complete search history.

(56) References Cited

U.S. PATENT DOCUMENTS

| | | | |
|---|---|---|---|
| 5,384,940 A | 1/1995 | Soule et al. | |
| 6,307,748 B1 * | 10/2001 | Lin et al. | 361/704 |
| 6,412,546 B1 * | 7/2002 | Lin et al. | 165/80.3 |
| 6,456,490 B1 * | 9/2002 | Lai | 361/684 |
| 6,752,577 B2 * | 6/2004 | Chen et al. | 411/508 |
| 7,116,556 B2 * | 10/2006 | Lee et al. | 361/704 |
| 7,161,808 B2 * | 1/2007 | Atkinson | 361/719 |
| 7,164,583 B2 * | 1/2007 | Lee et al. | 361/704 |
| 7,180,743 B2 * | 2/2007 | Chen et al. | 361/704 |
| 7,295,436 B2 * | 11/2007 | Cheon | 361/699 |

* cited by examiner

*Primary Examiner*—Gregory D Thompson

(57) ABSTRACT

A heat sink assembly (100) includes a fastening device (20) and a heat sink (10). The fastening device includes a sleeve (24), a pin (22) received in the sleeve and a biasing means (26) disposed around the sleeve. The sleeve includes a locking portion (246) formed at a bottom end thereof. The pin includes an engaging portion (226) formed at a bottom end thereof. At least a slot (248) is defined through the locking portion of the sleeve (24). The engaging portion extends outwardly through the slot and resiliently abuts against a bottom surface of the heat sink. The biasing means is slightly deformed between a top end of the fastening device and a top surface of the heat sink, thereby keeping the fastening device in a vertical position with respect to the heat sink.

14 Claims, 8 Drawing Sheets

FASTENING DEVICE AND HEAT SINK ASSEMBLY USING THE SAME

BACKGROUND OF THE INVENTION

1. Field of the Invention

The present invention relates generally to a heat sink assembly, and particularly to a heat sink assembly incorporating at least one fastening device which can conveniently mount a heat sink of the heat sink assembly to a heat generating electronic component.

2. Description of Related Art

As computer technology continues to advance, electronic components such as central processing units (CPUs) of computers are being made to provide faster operational speeds and greater functional capabilities. When a CPU operates at a high speed in a computer enclosure, its temperature increases rapidly. It is desirable to dissipate the generated heat of the CPU quickly, for example, by using a heat sink attached to a surface of the CPU. This allows the CPU and other high-performance electronic components in the enclosure to operate within their normal operating temperature ranges, thereby assuring the quality of data management, storage and transfer for the CPU. Oftentimes, fastening devices are required for mounting the heat sink to the CPU.

For example, U.S. Pat. No. 5,384,940 discloses a plurality of conventional fastening devices for mounting a heat sink to an electronic component. The heat sink has a flat base which defines a plurality of holes for receiving the fastening devices therethrough, and a plurality of fins projecting upwardly from a top face of the flat base. Each fastening device comprises a cylindrical head, a shaft body extending downwardly from the head and a cone-shaped locking end. A spring is disposed around the shaft body. The fastening device is preferably formed with a narrow slot longitudinally extending from the locking end into a lower portion of the shaft body thereby providing resiliency to the locking end in a radial direction thereof. In assembly, each fastening device is inserted into the corresponding hole in the flat base of the heat sink and the locking end engages with a corresponding hole defined in a printed circuit board (PCB) thereby securing the heat sink to the electronic component mounted on the PCB.

The fastening devices and the heat sink are generally required to be pre-assembled together before the heat sink is finally mounted to the electronic component in order to facilitate mounting of the heat sink by end users. However, the spring of the conventional fastening device is not elastically deformed to advantageously maintain the fastening device to stand in a vertical direction relative to the heat sink. The end users are required to manually manipulate the fastening device to align the locking end thereof properly with the corresponding hole of the PCB when the heat sink is finally being mounted to the electronic component by the end users, which increases operating complexity and difficulty for the end users.

Therefore, an improved fastening device for mounting a heat sink to a heat generating electronic component which can overcome the above problem is desired.

SUMMARY OF THE INVENTION

The present invention relates to a heat sink fastening device and a heat sink assembly including at least a heat sink fastening device and a heat sink. According to an embodiment of the present invention, the fastening device includes a sleeve, a pin received in the sleeve and a biasing means disposed around the sleeve. The sleeve includes a main body and a locking portion formed at a bottom end of the main body. The pin includes a body and an engaging portion formed at a bottom end of the body. At least a slot is defined through the locking portion and a portion of the main body of the sleeve. The engaging portion is received in the slot. Before the heat sink assembly is finally mounted to an electronic component mounted on a circuit board, the engaging portion of the fastening device abuts against a bottom of the heat sink, and the biasing means is slightly deformed between a top end of the fastening device and a top of the heat sink, thereby keeping the fastening device in a vertical position with respect to the heat sink.

Other advantages and novel features of the present heat sink assembly will be drawn from the following detailed description of a preferred embodiment of the present invention with attached drawings, in which:

DETAILED DESCRIPTION OF THE INVENTION

Figure 1:
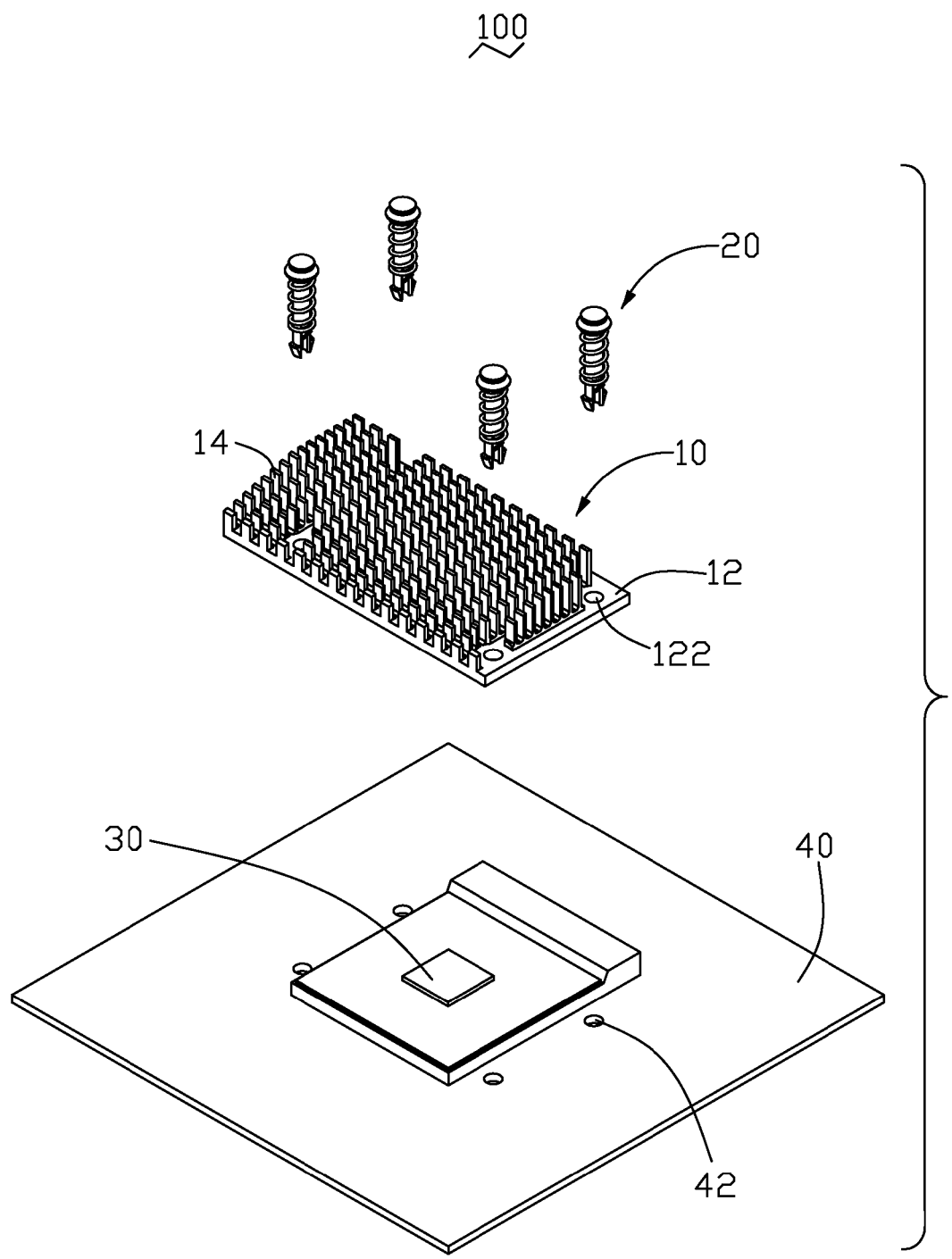
FIG. 1 is an exploded view of a heat sink assembly in accordance with a preferred embodiment of the present invention, together with a heat generating electronic component mounted on a PCB.

Referring to FIG. 1, a heat sink assembly 100 according to a preferred embodiment of the present invention is shown. The heat sink assembly 100 includes a heat sink 10, and a plurality of fastening devices 20, wherein the fastening devices 20 are used to mount the heat sink 10 to a heat generating electronic component 30 such as a CPU mounted on a PCB 40 via a socket (not labeled).

The heat sink 10 includes a flat, rectangular base 12 and a plurality of fins 14 projecting upwardly from a top surface thereof. A plurality of mounting holes 122 are defined at four corners of the base 12 for extension of the fastening devices 20, and the PCB 40 is also provided with fixing holes 42 in the same pattern as the mounting holes 122. The fixing holes 42 surround the electronic component 30, and are aligned with the mounting holes 122, respectively.

Figure 2:
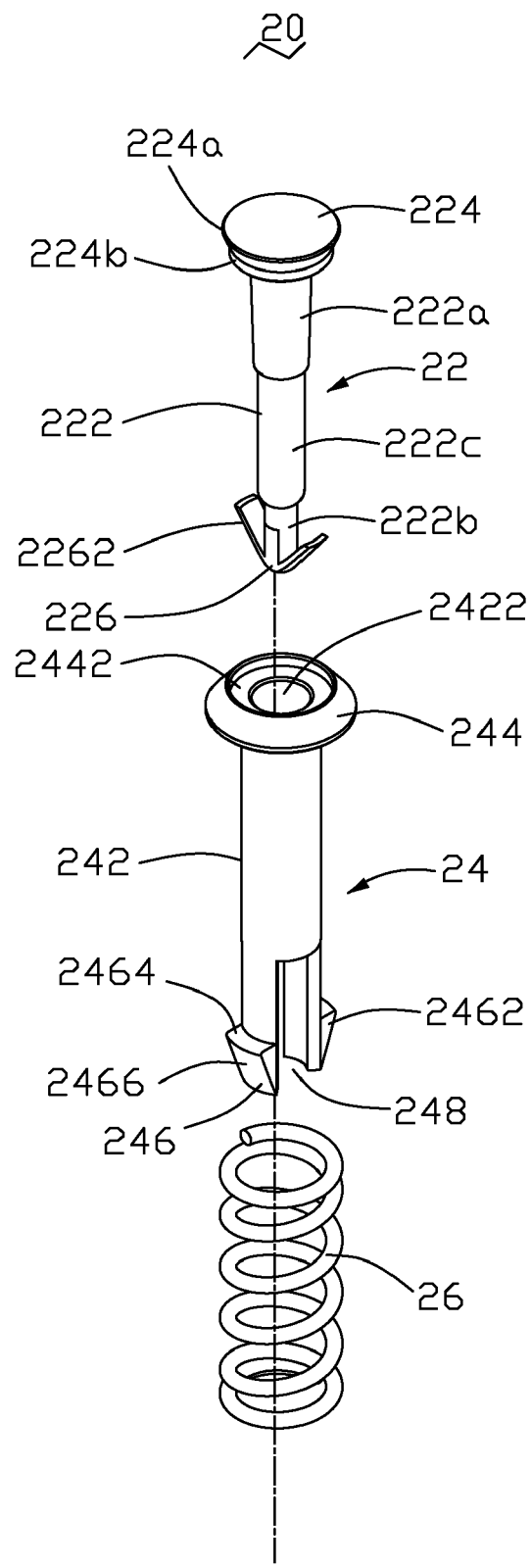
FIG. 2 is an exploded view of a fastening device of the heat sink assembly of FIG. 1.
Figure 3:
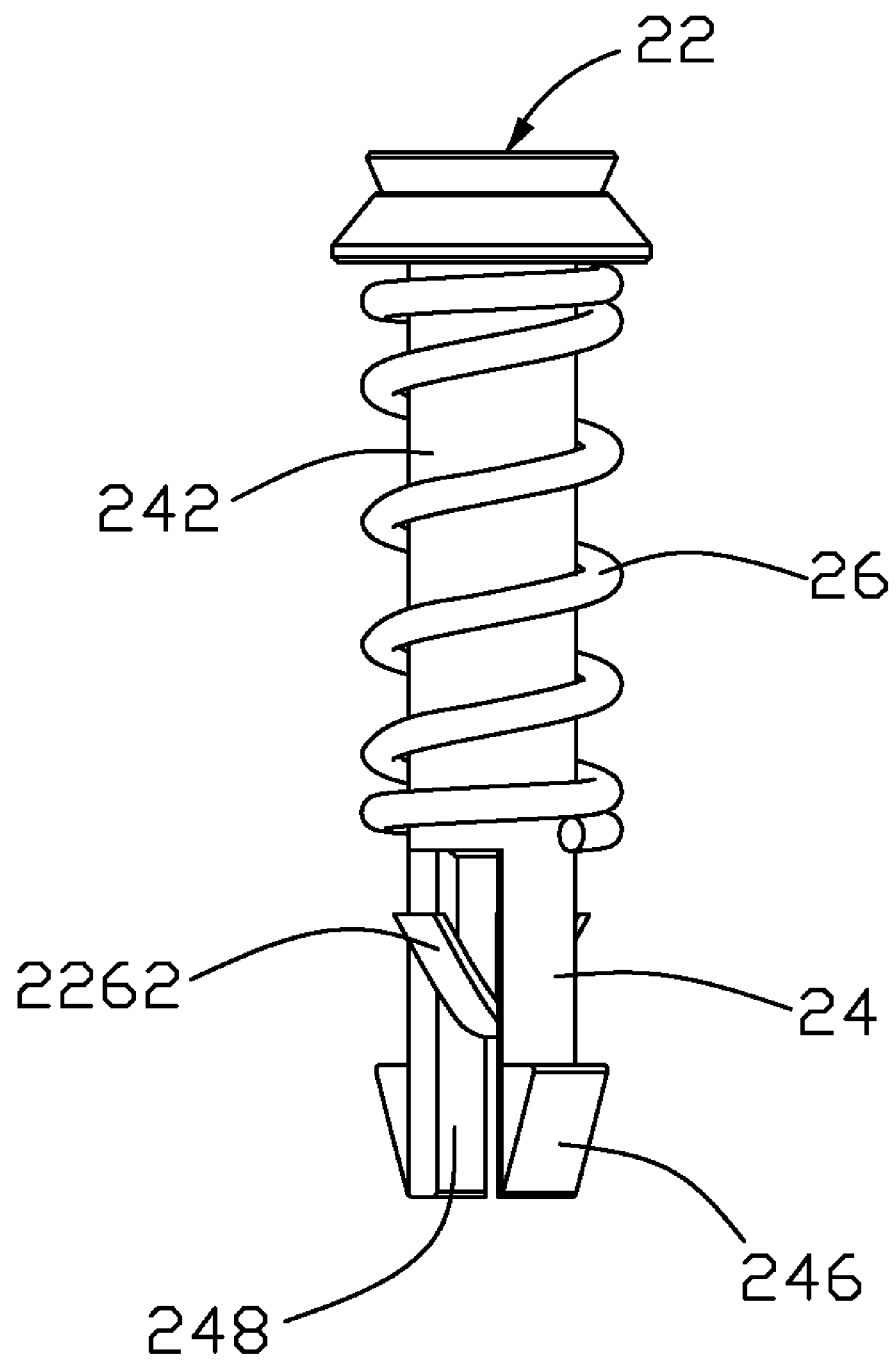
FIG. 3 is an assembled view of the fastening device of FIG. 2.

Referring also to FIG. 2 and FIG. 3, each fastening device 20 includes a pin 22, a sleeve 24, and a spring 26 disposed around the sleeve 24. The pin 22 and the sleeve 24 are preferably made of plastic. The pin 22 includes a body 222, an expanded cap 224 formed at a top end of the body 222, and an engaging portion 226 formed at a bottom end of the body 222. The body 222 includes a top section 222a adjacent to the cap 224, a bottom section 222b adjacent to the engaging portion 226 and a middle section 222c between the top and the bottom sections 222a, 222b. The three sections 222a, 222b, 222c of the body 222 are cylindrical and coaxial to each other. A diameter of the top section 222a is greater than that of the middle section 222c and a diameter of the bottom section 222b is less than that of the middle section 222c. A top section 224a of the cap 224 is in the shape of an inverted cone and a bottom section 224b of the cap 224 is in the form of a column. A diameter of the top section 224a of the cap 224 is greater than that of the bottom section 224b of the cap 224 and the diameter of the bottom section 224b of the cap 224 is greater than that of the top section 222a of the body 222. The engaging portion 226 has a V-shaped configuration in profile, and includes a pair of laterally extended barbs 2262 each extending outwardly and upwardly from a bottommost end of the pin 22. As a result of the fact that the diameter of the bottom section 222b of the body 222 is smaller than that of the middle section 222c and much smaller than that of the top section 222a of the body 222, a elastically deformable capability is therefore advantageously imparted to the barbs 2262 so that the pin 22 can be combined to the sleeve 24 easily.

The sleeve 24 includes a cylindrical, hollow main body 242, an enlarged head 244 formed at a top end of the main body 242, and a locking portion 246 formed at a bottom end of the main body 242. A diameter of the main body 242 corresponds to that of each of the mounting holes 122 of the heat sink 10 and the fixing holes 42 of the PCB 40. The sleeve 24 defines axially a central bore 2422 for receiving the pin 22 therein. The head 244 of the sleeve 24 is cone-shaped. A diameter of the head 244 is greater than that of the main body 242 and decreases gradually from a bottom end towards a top end thereof. A recess 2442 is defined in the top end of the head 244 for fittingly receiving the column-shaped bottom section 224b of the cap 224 of the pin 22 therein. The locking portion 246 includes a pair of wedge-shaped prongs 2462 extending radially outwardly from an outer peripheral surface of the bottom end of the sleeve 24. Each prong 2462 has a taper-shaped outer surface 2466 and a radially extended locking shoulder 2464 at its topmost position. The shoulder 2464 has a diameter greater than that of the main body 242 and also greater than that of each of the fixing holes 42 of the PCB 40. A slot 248 is centrally defined through the locking portion 246 and extends longitudinally into a lower section of the main body 242 of the sleeve 24 for receiving the engaging portion 226 of the pin 22 after the pin 22 is assembled to the sleeve 24. The slot 248 also imparts sufficient flexibility to the locking portion 246 so that the locking portion 246 can be deformed easily.

The spring 26 is disposed around the main body 242 of the sleeve 24 and captured between the barbs 2262 of the pin 22 and the head 244 of the sleeve 24 (shown in FIG. 3). Understandably, the spring 26 can also be other types of biasing means such as an inverted V-shaped metal tab with a hole defined in a middle thereof for receiving the main body 242 of the sleeve and two opposite wings extending downwardly from the middle.

The pin 22 is downwardly inserted into the bore 2422 of the sleeve 24. The column-shaped bottom section 224b of the cap 224 of the pin 22 is received in the recess 2442 of the sleeve 24. The barbs 2262 of the engaging portion 226 are firstly contracted due to being compressed in the bore 2422 of the sleeve 24 and then released to enter into the slot 248 of the sleeve 24 from opposite sides of the slot 248. The spring 26 is deposed around the main body 242 of the sleeve 24 and captured between the barbs 2262 of the pin 22 and the head 244 of the sleeve 24.

Figure 4:
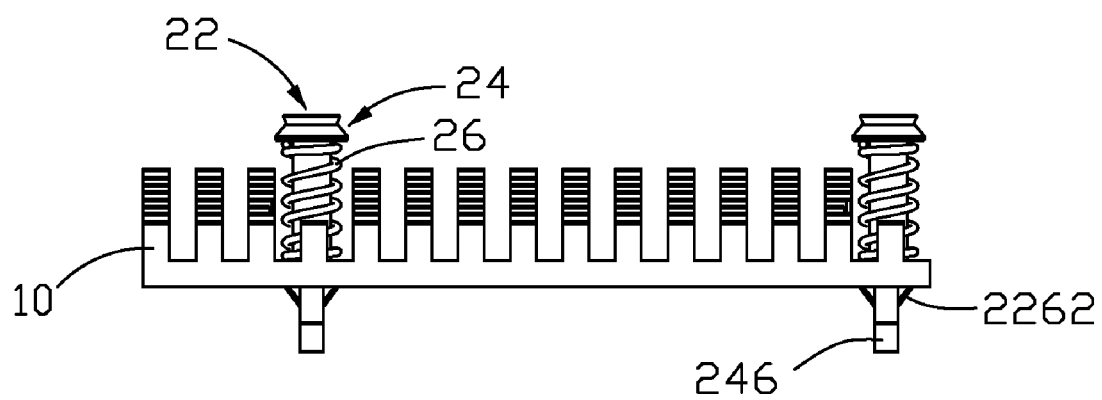
FIG. 4 is an assembled view of the fastening devices and the heat sink of FIG. 1.
Figure 5:
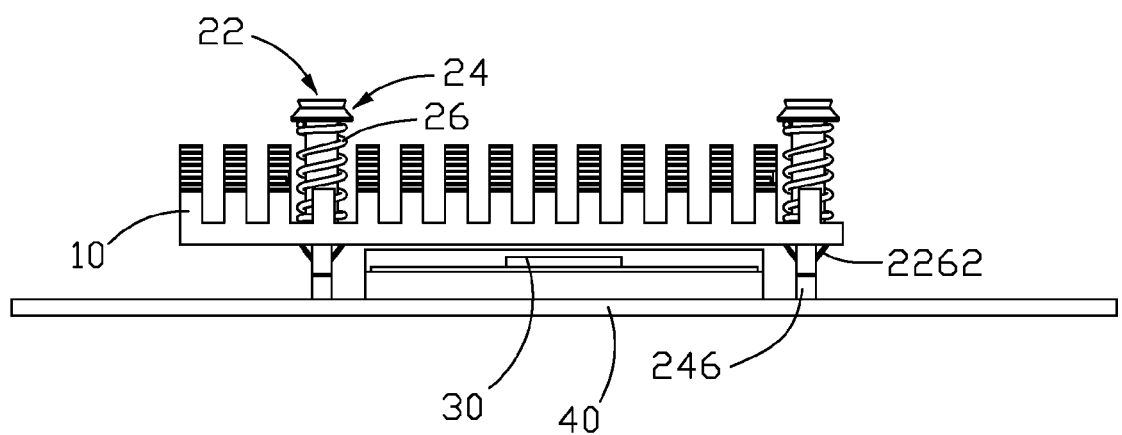
FIG. 5 is a side view of the heat sink assembly and electronic component and PCB of FIG. 1, with the fastening devices thereof in an unlocked position.
Figure 6:
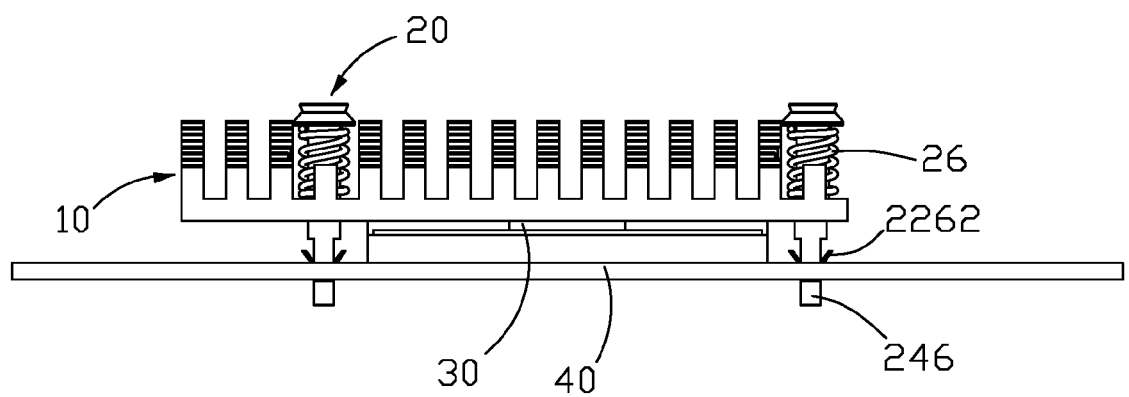
FIG. 6 is a side view of the heat sink assembly and electronic component and PCB of FIG. 1, with the fastening devices thereof in a locked position.
Figure 7:
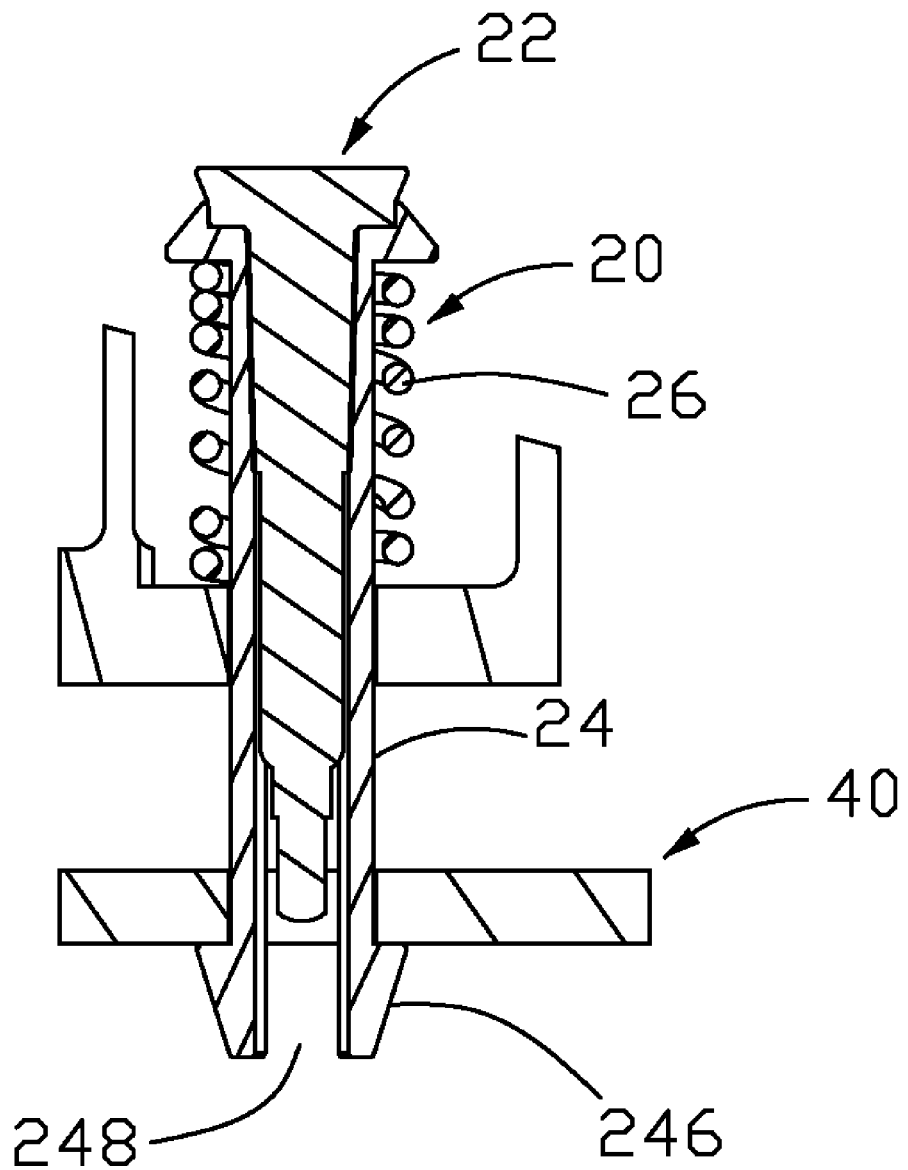
FIG. 7 is a partially cross-sectional view, in an enlarged scale, of a portion of the heat sink assembly and PCB of FIG. 6.
Figure 8:
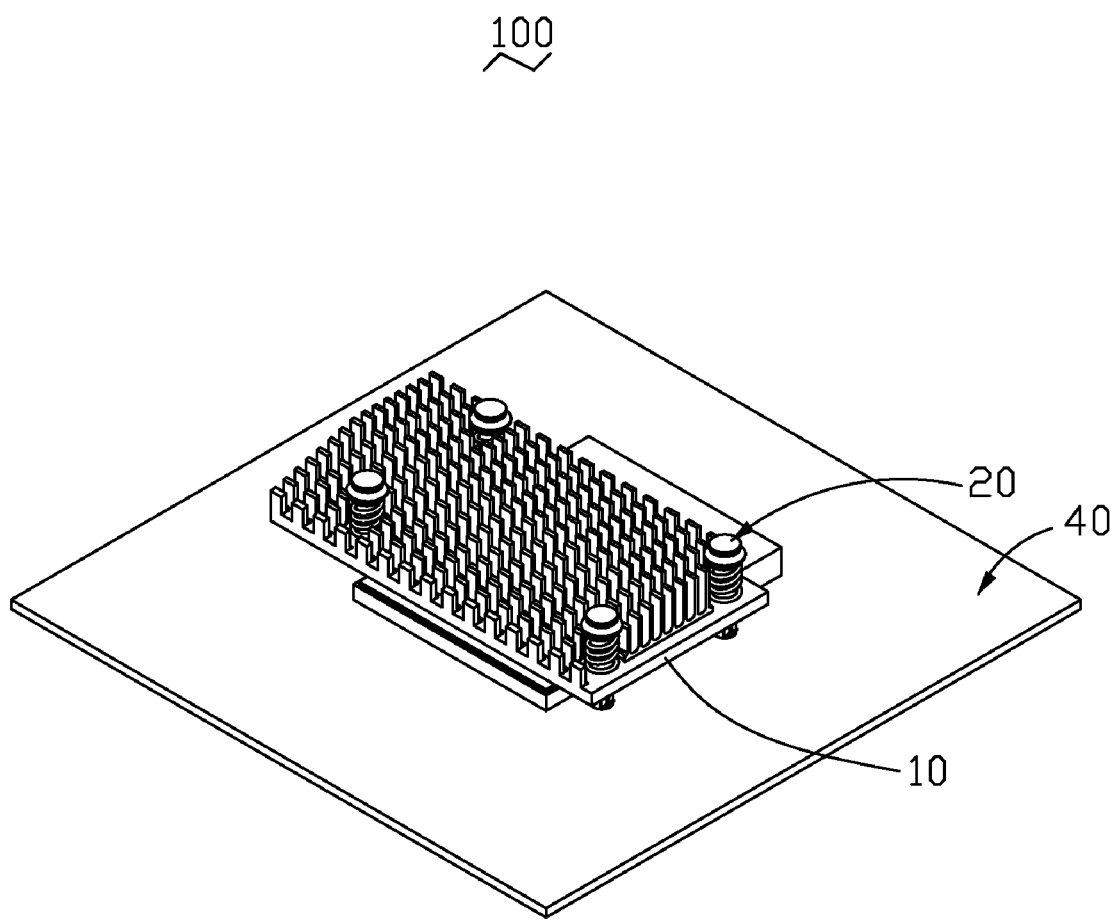
FIG. 8 is an assembled, isometric view of the heat sink assembly and electronic component and PCB of FIG. 1.

With reference to FIG. 4, when the fastening device 20 is pre-assembled to the heat sink 10, the locking portion 246 of the sleeve 24 is first positioned in a top of a corresponding mounting hole 122 of the heat sink 10, the cap 224 of the pin 22 is then pushed downwardly to move the fastening device 20 downwardly, and the locking portion 246 of the sleeve 24 and the engaging portion 226 of the pin 22 are respectively compressed and sequentially pass through the corresponding mounting hole 122 of the heat sink 10. After the engaging portion 226 passes through the hole 122, the barbs 2262 of the engaging portion 226 restore to their original shapes and engage with a bottom surface of the base 12 of the heat sink 10, while at the same time, the spring 26 is slightly deformed and compressed between the head 244 of the sleeve 24 and a top surface of the base 12 of the heat sink 10. The compressed spring 26 and the barbs 2262 of the engaging portion 226 cooperatively exert a force on the heat sink 10 thereby keeping the fastening device 20 being positively located in a vertical relationship with respect to the heat sink 10.

Referring now to FIGS. 5-8, in assembly, the heat sink 10 is placed on a top surface of the electronic component 30. The two prongs 2462 of the locking portion 246 of each fastening device 20 are lined up with a corresponding fixing hole 42 of the PCB 40 on which the electronic component 30 is mounted. The cap 224 of the pin 22 of each fastening device 20 is then manually pushed downwardly to cause the fastening device 20 to move downwardly; thus, the spring 26 which is disposed around the fastening device 20 is further compressed and elastically deformed. At the same time, the prongs 2462 of the locking portion 246 enter into the fixing hole 42 of the PCB 40, and the taper-shaped outer surface 2466 are brought into interaction with inner surface of the fixing hole 42 of the PCB 40 to cause the prongs 2462 to contract inwardly towards each other. Once the prongs 2462 have passed through the fixing hole 42, the prongs 2462 elastically restore back to their original positions. The locking shoulders 2464 of the locking portion 246 abut against a bottom surface of the PCB 40 around the fixing hole 42 (see FIG. 7). The compressed spring 26 provides an elastic force for pushing the heat sink 10 downwardly toward the PCB 40 thereby firmly retaining the heat sink 10 to the electronic component 30. Therefore, the heat sink 10 can have an intimate contact with the electronic component 30.

The present fastening device 20 is provided with the engaging portion 226 formed on the bottom end of the pin 22. After the fastening device 20 is pre-assembled to the heat sink 10, the biasing means such as the spring 26 is slightly deformed and the barbs 2262 resiliently abut against the bottom surface of the base 12 of the heat sink 10; therefore, the fastening device 20 is capable of maintaining the vertical orientation with respect to the heat sink 10, which makes the following assembly of the heat sink 10 to the PCB 40 become easy.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink fastening device comprising:
a pin comprising a body and an engaging portion formed at an end of the body;
a sleeve comprising a main body and a locking portion formed at an end of the main body; and
a biasing means disposed around the main body of the sleeve; wherein the main body of the sleeve defines axially a central bore for receiving the pin therein, at least a slot is defined through the locking portion and extends to a portion of the main body of the sleeve for receiving the engaging portion of the pin, the biasing means cooperating with the engaging portion for maintaining the fastening device in a vertical orientation when the fastening device is mounted to a heat sink.

2. The fastening device as claimed in claim 1, wherein the pin and the sleeve are each made of plastic.

3. The fastening device as claimed in claim 1, wherein the body of the pin and the main body of the sleeve are each cylindrical.

4. The fastening device as claimed in claim 1, wherein an expanded cap is formed at another end of the body of the pin, and a head is formed at another end of the main body of the sleeve.

5. The fastening device as claimed in claim 4, wherein a recess is defines in a top surface of the head of the sleeve, and the cap of the pin has at least a portion received in the recess.

6. The fastening device as claimed in claim 1, wherein the engaging portion comprises a plurality of barbs extending radially outwardly from the pin, and the barbs extend outwardly through the at least a slot of the sleeve.

7. The fastening device as claimed in claim 1, wherein the locking portion of the sleeve comprises a plurality of wedge-shaped prongs extending radially outwardly from the sleeve, each prong has a taper-shaped outer surface and a locking shoulder formed at a topmost portion thereof.

8. The fastening device as claimed in claim 4, wherein the biasing means is a spring located between the head of the sleeve and the engaging portion of the pin.

9. A heat sink assembly comprising:
a heat sink defining at least a mounting hole therein; and
at least a fastening device comprising:
a sleeve received in the at least a mounting hole of the heat sink and defining a central bore, the sleeve comprising a main body and a locking portion formed at a bottom end of the main body;
a pin comprising a body received in the central bore of the sleeve and an engaging portion formed at a bottom end of the body; and
a biasing means associated with the main body of the sleeve; wherein
at least a slot is defined through the locking portion and a portion of the main body of the sleeve for receiving the engaging portion of the pin therein, the engaging portion of the pin abuts against a bottom of the heat sink and the biasing means is slightly deformed between a top end of the at least a fastening device and a top of a base of the heat sink.

10. The heat sink assembly as claimed in claim 9, wherein the pin comprises a plurality of barbs extending from the bottom end of the pin, and the barbs are received in said at least a slot of the sleeve.

11. The heat sink assembly as claimed in claim 9, wherein an expanded cap is formed at a top end of the body of the pin, and a head is formed at a top end of the main body of the sleeve.

12. The heat sink assembly as claimed in claim 11, wherein a recess is defined in a top surface of the head, at least a portion of the cap of the pin is received in the recess.

13. The heat sink assembly as claimed in claim 9, wherein the locking portion of the sleeve comprises a plurality of wedge-shaped prongs, and each prong has a taper-shaped outer surface and a locking shoulder at a top portion thereof.

14. An electronic assembly comprising:
a printed circuit board having a heat generating electronic component mounted thereon;
a heat sink mounted on the heat generating electronic component and thermally connecting therewith; and
at least a fastening device fastening the heat sink to the printed circuit board so that the heat sink can have an intimate contact with the heat generating electronic component, the at least a fastening device comprising:
a sleeve extended through the heat sink and the printed circuit board, having a bottom locking portion securely engaging with a bottom surface of the printed circuit board;
a spring surrounding the sleeve and compressed between a top head of the sleeve and a top surface of a base of the heat sink;
a pin extended through a bore of the sleeve, having a top cap over the top head of the sleeve and lower barbs extending out of the sleeve and located between a top surface of the printed circuit bard and a bottom surface of the heat sink.

* * * * *